(12) United States Patent
Wu

(10) Patent No.: US 8,138,529 B2
(45) Date of Patent: Mar. 20, 2012

(54) PACKAGE CONFIGURATIONS FOR LOW EMI CIRCUITS

(75) Inventor: Yifeng Wu, Goleta, CA (US)

(73) Assignee: Transphorm Inc., Goleta, CA (US)

( * ) Notice: Subject to any disclaimer, the term of this patent is extended or adjusted under 35 U.S.C. 154(b) by 18 days.

(21) Appl. No.: 12/611,018

(22) Filed: Nov. 2, 2009

(65) Prior Publication Data
US 2011/0101466 A1    May 5, 2011

(51) Int. Cl.
*H01L 29/66* (2006.01)
(52) U.S. Cl. ........ 257/268; 257/392; 257/401; 257/499; 257/713; 257/724; 257/776; 257/E27.061; 257/E23.101; 257/E23.17
(58) Field of Classification Search .......... 257/268, 257/392, 401, E27.061, 499, 713, 724, 776, 257/E23.101, E23.17
See application file for complete search history.

(56) References Cited

U.S. PATENT DOCUMENTS

| | | | |
|---|---|---|---|
| 4,384,287 A * | 5/1983 | Sakuma | 345/60 |
| 4,728,826 A | 3/1988 | Einzinger et al. | |
| 4,808,853 A | 2/1989 | Taylor | |
| 5,198,964 A * | 3/1993 | Ito et al. | 361/717 |
| 5,379,209 A | 1/1995 | Goff | |
| 5,493,487 A | 2/1996 | Close et al. | |
| 5,637,922 A * | 6/1997 | Fillion et al. | 257/728 |
| 5,952,856 A | 9/1999 | Horiguchi et al. | |
| 6,008,684 A | 12/1999 | Ker et al. | |
| 6,107,844 A | 8/2000 | Berg et al. | |
| 6,130,831 A | 10/2000 | Matsunaga | |
| 6,333,617 B1 | 12/2001 | Itabashi et al. | |
| 6,395,593 B1 | 5/2002 | Pendharkar et al. | |
| 6,521,940 B1 | 2/2003 | Vu et al. | |
| 6,781,423 B1 * | 8/2004 | Knoedgen | 327/110 |
| 6,900,657 B2 | 5/2005 | Bui et al. | |
| 7,116,567 B2 | 10/2006 | Shelton et al. | |
| 7,304,331 B2 | 12/2007 | Saito et al. | |
| 7,443,648 B2 * | 10/2008 | Cutter et al. | 361/139 |
| 7,501,669 B2 | 3/2009 | Parikh et al. | |

(Continued)

FOREIGN PATENT DOCUMENTS

CN    101978589 A    2/2011

(Continued)

OTHER PUBLICATIONS

Yifeng Wu et al., "Semiconductor Heterostructure Diodes", U.S. Appl. No. 12/332,284, filed Dec. 10, 2008, 51 pp.

(Continued)

*Primary Examiner* — Tu-Tu Ho
(74) *Attorney, Agent, or Firm* — Fish & Richardson P.C.

(57) ABSTRACT

An electronic component includes a high voltage switching transistor encased in a package. The high voltage switching transistor comprises a source electrode, a gate electrode, and a drain electrode all on a first side of the high voltage switching transistor. The source electrode is electrically connected to a conducting structural portion of the package. Assemblies using the abovementioned transistor with another transistor can be formed, where the source of one transistor can be electrically connected to a conducting structural portion of a package containing the transistor and a drain of the second transistor is electrically connected to the second conductive structural portion of a package that houses the second transistor. Alternatively, the source of the second transistor is electrically isolated from its conductive structural portion, and the drain of the second transistor is electrically isolated from its conductive structural portion.

47 Claims, 8 Drawing Sheets

U.S. PATENT DOCUMENTS

| | | | |
|---|---|---|---|
| 7,639,064 B2 | 12/2009 | Hsiao et al. | |
| 7,851,825 B2 | 12/2010 | Suh et al. | |
| 7,915,643 B2 | 3/2011 | Suh et al. | |
| 2002/0125920 A1 | 9/2002 | Stanley | |
| 2003/0178654 A1 | 9/2003 | Thornton | |
| 2005/0067716 A1* | 3/2005 | Mishra et al. | 257/778 |
| 2005/0077947 A1 | 4/2005 | Munzer et al. | |
| 2005/0189561 A1 | 9/2005 | Kinzer et al. | |
| 2005/0189562 A1 | 9/2005 | Kinzer et al. | |
| 2006/0033122 A1* | 2/2006 | Pavier et al. | 257/177 |
| 2006/0043499 A1 | 3/2006 | De Cremoux et al. | |
| 2006/0060871 A1 | 3/2006 | Beach | |
| 2006/0102929 A1 | 5/2006 | Okamoto et al. | |
| 2006/0176007 A1 | 8/2006 | Best | |
| 2006/0237825 A1* | 10/2006 | Pavier et al. | 257/666 |
| 2007/0018210 A1 | 1/2007 | Sheppard | |
| 2007/0080672 A1 | 4/2007 | Yang | |
| 2008/0017998 A1* | 1/2008 | Pavio | 257/787 |
| 2008/0136390 A1* | 6/2008 | Briere | 323/282 |
| 2008/0191342 A1 | 8/2008 | Otremba | |
| 2008/0203559 A1* | 8/2008 | Lee et al. | 257/718 |
| 2008/0248634 A1* | 10/2008 | Beach | 438/483 |
| 2008/0272404 A1 | 11/2008 | Kapoor | |
| 2008/0283844 A1 | 11/2008 | Hoshi et al. | |
| 2009/0072240 A1 | 3/2009 | Suh et al. | |
| 2009/0072269 A1 | 3/2009 | Suh et al. | |
| 2009/0072272 A1 | 3/2009 | Suh et al. | |
| 2009/0146185 A1 | 6/2009 | Suh et al. | |
| 2009/0201072 A1 | 8/2009 | Honea et al. | |
| 2009/0215230 A1* | 8/2009 | Muto et al. | 438/124 |
| 2009/0236728 A1* | 9/2009 | Satou et al. | 257/692 |
| 2009/0267078 A1 | 10/2009 | Mishra et al. | |
| 2010/0067275 A1 | 3/2010 | Wang et al. | |
| 2011/0121314 A1 | 5/2011 | Suh et al. | |

FOREIGN PATENT DOCUMENTS

| | | |
|---|---|---|
| EP | 2 188 842 | 5/2010 |
| EP | 2 243 213 | 10/2010 |
| JP | 2000-124358 | 4/2000 |
| JP | 2003/244943 | 8/2003 |
| JP | 2003/338742 | 11/2003 |
| JP | 2006/033723 A | 2/2006 |
| JP | 2007/036218 A | 2/2007 |
| JP | 2007/215331 | 8/2007 |
| JP | 2007-294769 | 11/2007 |
| JP | 2008/199771 | 8/2008 |
| JP | 2010/539712 | 12/2010 |
| JP | 2010/512119 | 4/2011 |
| TW | 200941920 | 10/2009 |
| TW | 201027912 | 7/2010 |
| TW | 201036155 | 10/2010 |
| WO | WO 2009/036266 | 3/2009 |
| WO | WO 2009/102732 | 8/2009 |
| WO | WO 2010/039463 | 4/2010 |
| WO | WO 2010/090885 | 8/2010 |
| WO | WO 2011/053981 | 5/2011 |
| WO | WO 2011/085260 | 7/2011 |
| WO | WO 2011/097302 | 8/2011 |

OTHER PUBLICATIONS

Yifeng Wu et al., "III-Nitride Devices and Circuits", U.S. Appl. No. 12/368,248, filed Feb. 9, 2009, 28 pp.

Authorized officer Bon Gyoung Goo, International Search Report and Written Opinion in PCT/US2010/055129, mailed Jul. 1, 2011, 11 pages.

Authorized officer Keon Hyeong Kim, International Search Report and Written Opinion in PCT/US2008/076160, mailed Mar. 18, 2009, 11 pages.

Authorized officer Jae Woo Wee, International Search Report and Written Opinion in PCT/US2009/033699, mailed Sep. 21, 2009, 11 pages.

Authorized officer Dorothée Mülhausen, International Preliminary Report on Patentability in PCT/US2009/033699, mailed Aug. 26, 2010, 6 pages.

Authorized officer Sung Hee Kim, International Search Report and Written Opinion in PCT/US2009/057554, mailed May 10, 2010, 13 pages.

Authorized officer Gijsbertus Beijer, International Preliminary Report on Patentability in PCT/US2009/057554, mailed Apr. 7, 2011, 7 pages.

Authorized officer Sung Chan Chung, International Search Report and Written Opinion in PCT/US2010/021824, mailed Aug. 23, 2010, 9 pages.

Wu et al., "A 97.8% efficient GaN HEMT boost converter with 300-W otput power at 1MHz," Aug. 2008, Electronic Device Letters, IEEE, 29(8):824-826.

Authorized officer Simin Baharlou, International Preliminary Report on Patentability in PCT/US2008/076160, mailed Mar. 25, 2010, 6 pages.

Authorized officer Beate Giffo-Schmitt, International Preliminary Report on Patentability in PCT/US2010/021824, mailed Aug. 23, 2010, 6 pages.

Authorized officer Sung Joon Lee, International Search Report and Written Opinion in PCT/US2011/020592, mailed Sep. 19, 2011, 9 pages.

Chen, et al., "Single-Chip Boost Converter Using Monolithically Integrated AlGaN/GaN Lateral Field-Effect Rectifier and Normally Off HEMT," IEEE Electron Device Letters, May 2009, 30(5):430-432.

* cited by examiner

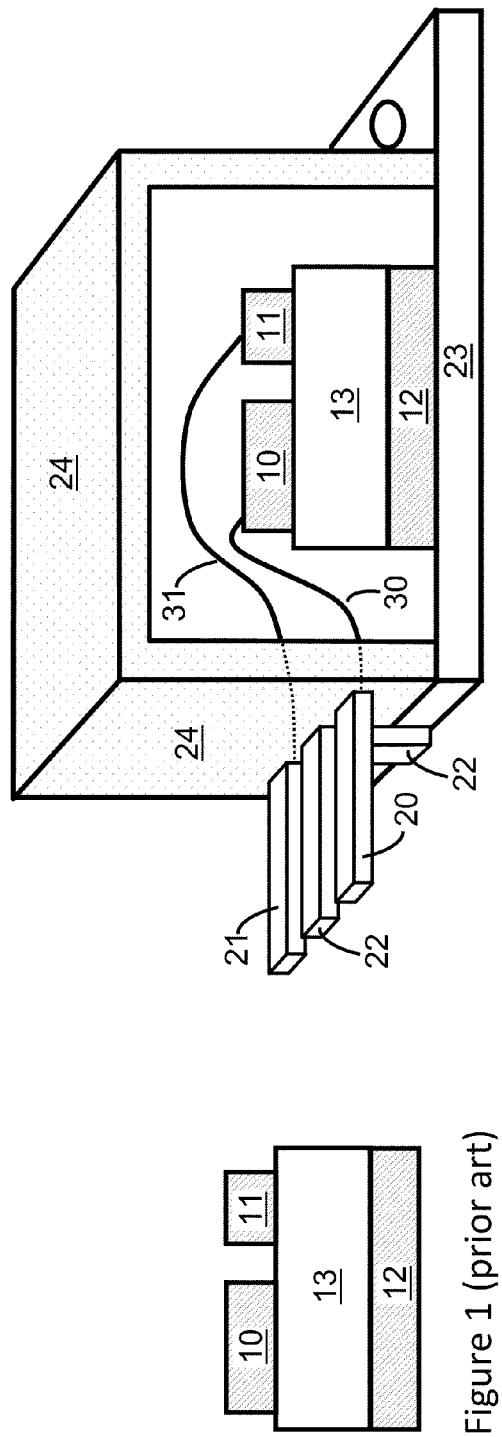
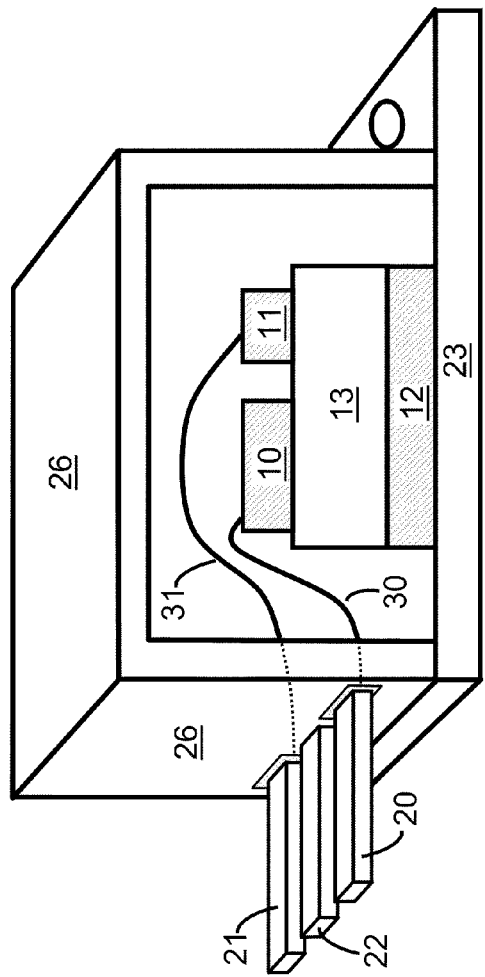
Figure 1 (prior art)
Figure 2 (prior art)
Figure 3 (prior art)

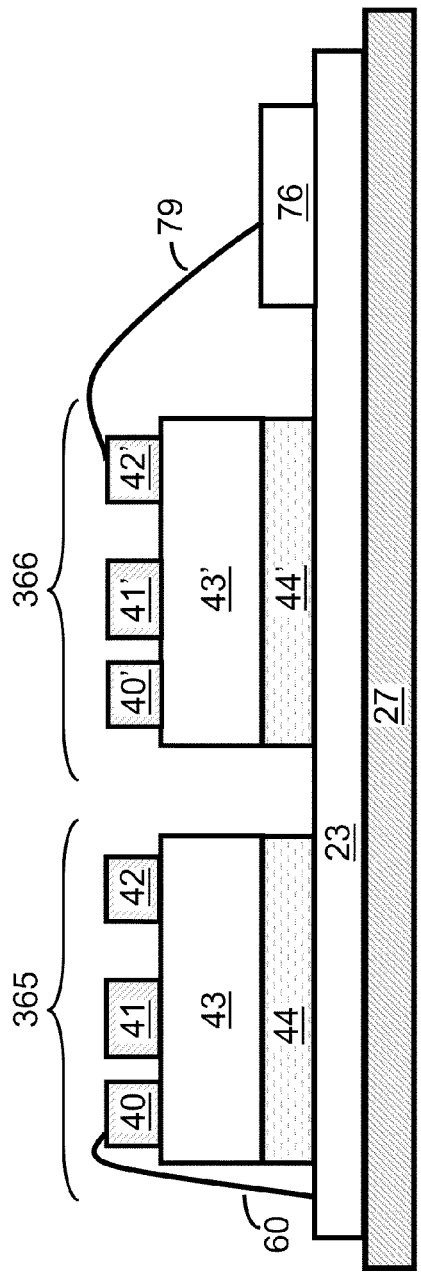
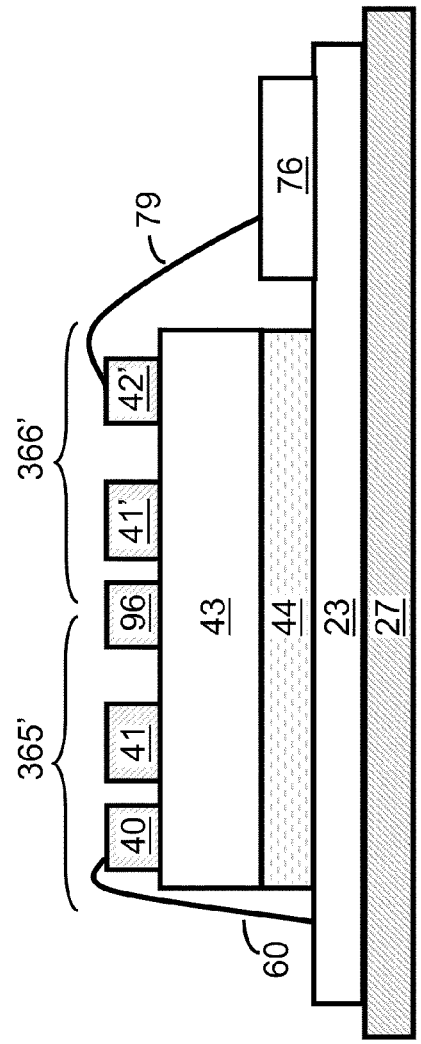
Figure 15
Figure 16

PACKAGE CONFIGURATIONS FOR LOW EMI CIRCUITS

TECHNICAL FIELD

Packaging configurations of semiconductor devices for various circuit applications are described.

BACKGROUND

Currently, most high voltage switching circuits are designed using silicon-based transistors, such as Si MOSFETs or IGBTs. A schematic diagram of a Si power MOSFET is shown in FIG. 1. As indicated, the source and gate electrodes 10 and 11, respectively, are on one side of the semiconductor body 13, and the drain electrode 12 is on the opposite side.

Prior to inserting the transistor of FIG. 1 into a discreet circuit, the transistor is encased in a package. Schematic examples of conventional transistor packages are shown in FIGS. 2 and 3. Referring to FIG. 2, the package includes structural portions, such as the case 24 and package base 23, as well as non-structural portions, such as leads 20-22. The case 24 is formed of an insulating material, the package base 23 is formed of a conducting material, the gate lead 21 is formed of a conducting material and is electrically connected to the gate electrode 11 of the transistor, the drain lead 22 is formed of a conducting material and is electrically connected to the package base 23, and the source lead 20 is formed of a conducting material and is electrically connected to the source electrode 10 of the transistor. As shown, the transistor is mounted directly to the package base 23 with drain electrode 12 in electrical and thermal contact to the package base 23. The drain electrode 12 and package base 23 are connected such that their electric potentials are about the same under all bias conditions and the heat generated during operation can easily dissipate to the package base. Drain lead 22 and drain electrode 12 are thereby electrically connected, since both are electrically connected to the package base 23. A metal bond wire 31 can form an electrical connection between the gate electrode 11 and the gate lead 21. Similarly, source lead 20 can be electrically connected to source electrode 10 via bond wire 30.

The package in FIG. 3 is similar to that of FIG. 2, except that the package case 26 is formed of a conducting material, so the package base 23 and case 26 are at the same electrical potential (i.e., they are electrically connected). For this package, the source and gate leads 20 and 21, respectively, are electrically isolated from the package case 26, while the drain lead 22 is electrically connected to the case. Drain electrode 12 is electrically connected to the package base 23, gate lead 21 is electrically connected to the gate electrode 11 of the transistor, and source lead 20 is electrically connected to the source electrode 10 of the transistor.

As shown in FIG. 4, when the packaged transistor of FIG. 2 is used in a circuit assembly or on a circuit board, it is typically mounted on a heat sink 27 with an insulating spacer 28 between the package base 23 and the heat sink 27 to form transistor assembly 25. The insulating spacer 28 is made thin to allow heat generated by the transistor to transfer to the heat sink through the insulating spacer 28. However, the insulating spacer 28 has at least a minimum thickness, because decreasing the thickness of the insulating spacer 28 increases the capacitance between the package base 23 and the heat sink 27. In many cases, the heat sink 27 is connected to a circuit ground, hence the capacitance between the drain and the heat sink translates to a capacitance between the drain and ground. When the heat sink is not connected to the circuit ground, there is typically a large capacitance between the heat sink and the circuit ground, since the surface area of the heat sink is typically much larger than that of the transistor. This again results in a large total capacitance between the drain and the circuit ground.

FIG. 5 shows a circuit schematic of the transistor assembly 25 of FIG. 4 after it is mounted on a circuit assembly or circuit board, and its source is connected to ground 33. Capacitor 32 represents the capacitance between the package base 23 and the circuit ground, i.e., the capacitance between drain electrode 12 and the circuit ground. During operation of the transistor assembly 25, the charging and discharging of capacitor 32 not only causes severe switching losses but also results in the emission of electromagnetic radiation, also known as electromagnetic interference (EMI), thereby degrading the performance of the circuit. Capacitor 32 can cause common-mode AC currents to flow to ground through a path outside the desired signal path. The larger the capacitance of capacitor 32, the higher the switching loss and the intensity of common-mode EMI emission, which results in degradation of electrical performance. Hence, there is a trade-off between improved electrical performance, which may require a thick insulating spacer 28, and dissipation of heat produced by the transistor during operation, which may require a thin insulating spacer. Device and package configurations are desirable for which both switching losses and EMI can be adequately mitigated and simultaneously heat can be adequately dissipated when the device is used in a circuit such as a high voltage, high power switching circuit.

SUMMARY

In one aspect, an electronic component includes a high voltage switching transistor encased in a package. The high voltage switching transistor comprises a source electrode, a gate electrode, and a drain electrode all on a first side of the high voltage switching transistor. The source electrode is electrically connected to a conductive structural portion of the package.

In one aspect, an assembly is described. The assembly includes a first transistor encased in a first package, the first package comprising a first conductive structural portion and a second transistor encased in a second package, the second package comprising a second conductive structural portion. A source of the first transistor is electrically connected to the first conductive structural portion and a drain of the second transistor is electrically connected to the second conductive structural portion.

In another aspect, an assembly is described. The assembly includes a first transistor comprising a first source, the first transistor encased in a first package, the first package comprising a first conductive structural portion and a second transistor comprising a second source and a second drain, the second transistor encased in a second package, the second package comprising a second conductive structural portion. The first source is electrically connected to the first conductive structural portion, the second source is electrically isolated from the second conductive structural portion, and the second drain is electrically isolated from the second conductive structural portion.

In yet another aspect, an electronic component is described. The component includes a first transistor, comprising a first source and a first drain, a second transistor, comprising a second source and a second drain, and a single package comprising a conductive structural portion, the package encasing both the first transistor and the second transistor.

The first source is electrically connected to the conductive structural portion of the package, the first drain is electrically connected to the second source, and the first transistor is directly mounted to the conductive structural portion of the package.

Implementations of the various devices may include one or more of the following features. The high voltage switching transistor can be a lateral device. The high voltage switching transistor can be a III-N transistor. The high voltage switching transistor can comprise an insulating or semi-insulating substrate. The high voltage switching transistor can be configured to operate at a bias of about 300V or higher. The high voltage switching transistor can be an enhancement mode transistor. The conductive structural portion of the package can comprise a package base. The conductive structural portion of the package can be electrically connected to a heat sink. The conductive structural portion of the package can be electrically connected to a circuit ground or a DC ground. The high voltage switching transistor can be a III-N transistor comprising an insulating or semi-insulating portion. The insulating or semi-insulating portion can be an insulating or semi-insulating substrate. The high voltage switching transistor can be mounted directly on the conductive structural portion of the package with the insulating or semi-insulating portion adjacent to or contacting the conductive structural portion of the package. A first ratio of EMI power produced during operation of the electronic component to a total output power of the electronic component can be less than a second ratio of EMI power produced during operation of a second electronic component to a total output power of the second electronic component, wherein the second electronic component comprises a high voltage switching transistor with a drain electrode electrically connected to a conductive structural portion of a package of the second electronic component, and the conductive structural portion of the package of the second electronic component is separated from the circuit ground or the DC ground by an insulating spacer. A first ratio of switching power loss incurred during operation of the electronic component to a total output power of the electronic component can be reduce as compared to a second ratio of switching power loss incurred during operation of a second component to a total output power of the second electronic component, wherein the second electronic component comprises a high voltage switching transistor with a drain electrode electrically connected to a conductive structural portion of a package of the second electronic component, and the conductive structural portion of the package of the second electronic component is separated from the circuit ground or the DC ground by an insulating spacer. The package can further comprise a gate lead, a source lead, and a drain lead, wherein the drain lead is between the gate lead and the source lead. The package can further comprise a gate lead, a source lead, and a drain lead, wherein the source lead is between the gate lead and the drain lead.

The first transistor or the second transistor can be a high voltage switching transistor. The first conductive structural portion can be mounted directly on a heat sink and can be electrically connected to the heat sink. The first conductive structural portion can be electrically connected to a circuit ground or a DC ground. The second conductive structural portion can be electrically connected to a DC high voltage supply. The second conductive structural portion can be separated from a circuit ground or a DC ground by an insulating spacer. A capacitance between the second conductive structural portion and the circuit ground or the DC ground can cause the second conductive structural portion to be AC grounded. A drain of the first transistor can be electrically connected to a source of the second transistor. The first transistor can be a low-side switch and the second transistor can be a high-side switch. A half bridge can be formed from a device described herein. A bridge circuit can be formed from a device described herein. The first transistor or the second transistor can be a III-N transistor. The first transistor or the second transistor can be a lateral device.

The first transistor and the second transistor can share a common substrate. The substrate can be an insulating or semi-insulating substrate. The first drain and the second source can be formed of a single electrode. A device or component can also include a capacitor, wherein the package encases the capacitor. The second drain can be electrically connected to a first terminal of the capacitor and a second terminal of the capacitor can be electrically connected to the conductive structural portion of the package. The package can comprise a first source lead, a first gate lead, a first drain lead, a second gate lead, and a second drain lead. The first transistor can further comprise a first gate, the second transistor further comprises a second gate, the conductive structural portion of the can be is electrically connected to the first source lead, the first gate can be electrically connected to the first gate lead, the second gate can be electrically connected to the second gate lead, the second drain can be electrically connected to the second drain lead, and the first drain and the second source can be both electrically connected to the first drain lead.

In some implementations, the devices described herein can include one or more of the following advantages. Packaged lateral high voltage transistors can reduce or eliminate the capacitance between the drain of the transistor and the circuit or DC ground that can result from the package configuration. Capacitance between the drain of the transistor and the circuit or DC ground can cause current to flow to a ground outside of the desired signal path, which can increase EMI or switching losses during operation of the device. Increased EMI or switching losses can degrade performance of the device or a circuit in which the device is included. Therefore, reducing or eliminating the capacitance between the drain of the transistor and the circuit or DC ground can result in a device or circuit that operates more efficiently. In addition, heat dissipation is improved by some of the transistors described herein. Heat dissipation can improve the longevity and performance of the device. Heat dissipation may also allow for the device to be used in a wider variety of applications.

DESCRIPTION OF DRAWINGS

FIG. 1 is a schematic diagram of a silicon-based semiconductor transistor of the prior art.

FIGS. 2-4 are perspective cross-sectional diagrams of packaged semiconductor transistors of the prior art.

FIGS. 15-16 are side views of electronic devices of a half bridge.

Like reference symbols in the various drawings indicate like elements.

DETAILED DESCRIPTION

Figure 6:
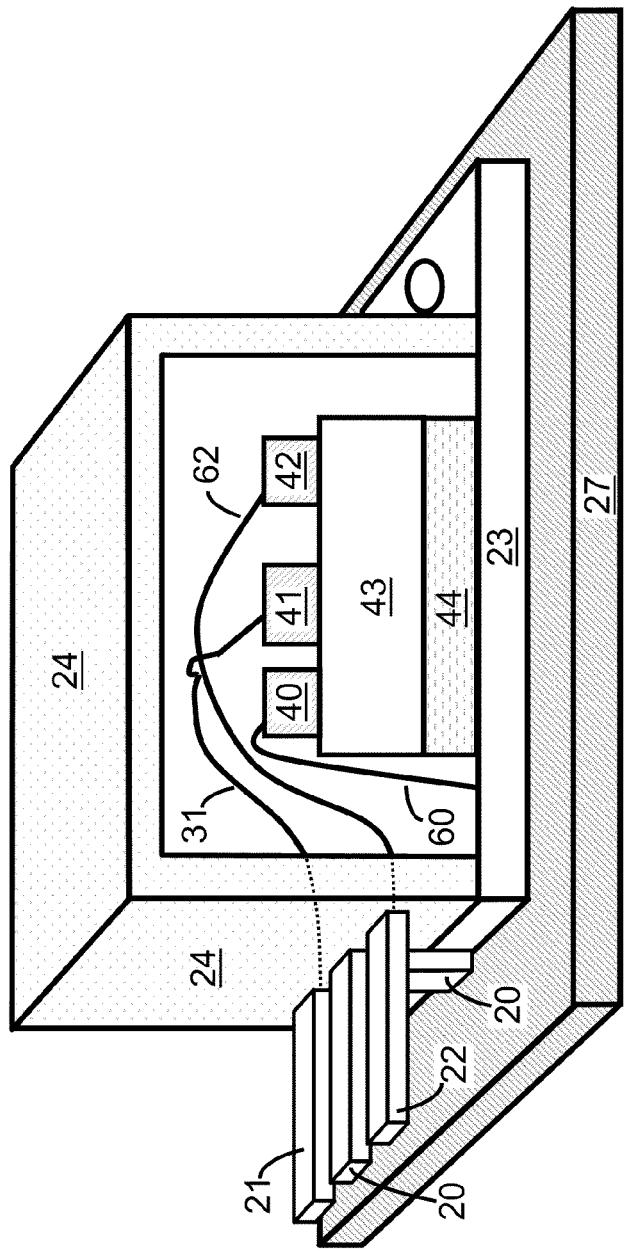
FIG. 6 is a perspective cross-sectional diagram of a packaged semiconductor transistor.

FIG. 6 is a schematic illustration of an electronic component, which includes a high voltage switching transistor encased in a package. As used herein, a high voltage switching transistor is a transistor optimized for high voltage switching applications. That is, when the transistor is off, it is capable of blocking high voltages, such as about 300V or higher, about 600V or higher, or about 1200V or higher, and when the transistor is on, it has a sufficiently low on-resistance $R_{ON}$ for the application in which it is used, i.e., it experiences sufficiently low conduction loss when a substantial current passes through the device. The high voltage switching transistor includes an insulating or semi-insulating portion 44, a semiconductor body 43, a source electrode 40, a gate electrode 41, and a drain electrode 42. In some implementations, the insulating or semi-insulating portion 44 is an insulating or semi-insulating substrate or carrier wafer, while in other implementations, the insulating or semi-insulating portion is an insulating or semi-insulating part of the semiconductor body. As used herein, a "substrate" is a material layer on top of which semiconductor material layers of a semiconductor device are epitaxially grown such that the crystalline structure of the portion of semiconductor material contacting or adjacent to the substrate at least partially conforms to or is at least partially determined by the crystalline structure of the substrate. In some implementations, the substrate does not contribute to any conduction of current through the semiconductor device.

The package includes structural portions, such as a case 24 and a package base 23, as well as non-structural portions, such as leads 20-22. As used herein, "structural portions" of a package are portions which form the basic shape or molding of the package and provide the structural rigidity of the package. In many cases, when a packaged transistor is used in a discrete circuit, a structural portion of the package is directly mounted to the circuit or circuit board. In the transistor package of FIG. 6, the package base 23 is formed of an electrically conducting material, i.e., the package base 23 is an electrically conductive structural portion of the package. The case 24 is formed of an insulating material, gate and drain leads 21 and 22, respectively, are each formed of a conducting material, and source lead 20 is formed of a conducting material and is electrically connected to the package base 23. As used herein, two or more contacts or other items are said to be "electrically connected" if they are connected by a material which is sufficiently conducting to ensure that the electric potential at each of the contacts or other items is intended to be the same, i.e., is about the same, at all times under any bias conditions. In some implementations, the package base 23 and case 24 are replaced by a conducting case, i.e., an electrically conductive structural portion, which completely surrounds the enclosed transistor (not shown), similar to the package case 26 in FIG. 3.

The insulating or semi-insulating portion 44 is mounted directly to the package base 23. In some implementations, an additional conducting or semiconducting layer, such as a conducting or semiconducting substrate, is included between the insulating or semi-insulating portion 44 and the package base 23 (not shown). When an additional conducting or semiconducting layer is included, the insulating or semi-insulating portion 44 can be a semi-insulating semiconductor layer, such as a semi-insulating semiconductor buffer layer on top of which the active semiconductor layers which are included in the semiconductor body 43 are formed. In some implementations, a semi-insulating layer is formed by doping a semiconductor layer to render the layer electrically insulating, although not as insulating as some insulating materials. The additional conducting or semiconductor layer can be part of the high voltage switching transistor, or it can be a separate layer. The package base 23 can be mounted directly to a heat sink 27 such that the package base 23 and heat sink 27 are in electrical and thermal contact, i.e., they are electrically connected, and heat generated by the transistor can dissipate through the heat sink 27. The heat sink 27 can also be a circuit ground, or it can be electrically connected to a circuit ground, in which case the package base 23 is electrically connected to circuit ground.

The source, gate, and drain electrodes 40-42 are all located on the uppermost side of the transistor. That is, they are located on the side of the semiconductor body 43 furthest from the portion of the transistor that is mounted to the package base 23. Having the source, drain, and gate electrodes on the same side of the semiconductor body can be achieved by employing a lateral device (i.e., a lateral high voltage switching transistor). Connector 31, which can be a bond wire and formed of an electrically conducting material, is at one end connected to gate electrode 41 and at the other end connected to gate lead 21, such that gate electrode 41 is electrically connected to gate lead 21. Similarly, drain lead 22 is electrically connected to drain electrode 42 via connector 62, which can be a bond wire and also formed of an electrically conducting material. Source electrode 40 is electrically connected to the case 23 via an electrically conducting connector 60, which can also be a bond wire. Source electrode 40 and source lead 20 can both be AC or DC grounded, since both are electrically connected to the package base 23, which is electrically connected to a heat sink 27, and the heat sink 27 can be a circuit ground or can be electrically connected to a circuit ground, and the circuit ground can be an AC or DC ground. As used herein, a node, device, layer, or component is said to be "AC grounded" if it is held at a fixed DC potential at all times during operation. AC and DC grounds are collectively referred to as "circuit grounds".

Figure 4:
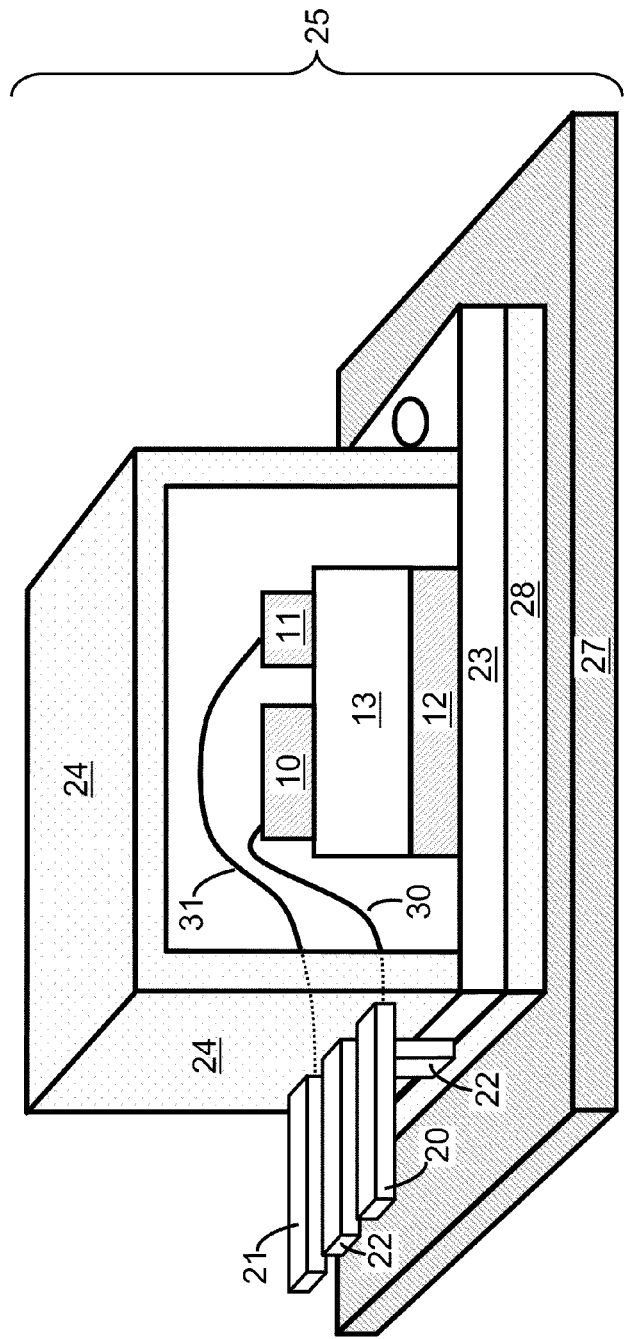
Figure 5:
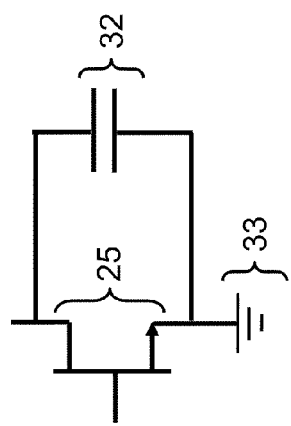
FIG. 5 is a circuit schematic of the packaged semiconductor transistor of FIG. 4.

Connectors 31, 60, and 62 are all electrically isolated from one another. In FIG. 6, source lead 20 is shown to be positioned between gate lead 21 and drain lead 22, which may be advantageous in that it can reduce interference between input and output currents as compared to a transistor in a package for which the drain lead is positioned between the gate lead and the source lead. However, in some cases it may be advantageous to have the drain lead 22 positioned between the gate lead 21 and the source lead 20, as illustrated in the packages of FIGS. 2-4, since this configuration may be more compatible with other existing parts and components that may be used in conjunction with the packaged transistor.

The high voltage switching transistor can be any transistor which can perform the functions of a high voltage switching transistor as previously described. In some implementations, the high voltage switching transistor is an enhancement mode device, i.e., a normally off device, such that the threshold voltage greater than 0V, such as about 1.5V-2V or greater. In other implementations, the high voltage switching transistor is a depletion mode device, i.e., a normally on device, such that the threshold voltage is less than 0V. The high voltage switching transistor can be a lateral device, since lateral transistors can be readily fabricated for which the source, drain, and gate electrodes are all on the same side of the device. The high voltage switching transistor can be a III-Nitride or III-N device or transistor, such as a III-N high electron mobility transistor (HEMT) or heterojunction field effect transistor (HFET). That is, the semiconductor body 43 can include at least two layers of III-N material. As used herein, the terms III-Nitride or III-N materials, layers, devices, etc., refer to a material or device comprised of a compound semiconductor material according to the stoichiometric formula $Al_xIn_yGa_zN$, where x+y+z is about 1. Examples of III-N devices and device structures which can be designed to satisfy the requirements for a high voltage switching transistor can be found in U.S. Publication number 2009-0072272, published Mar. 19, 2009, U.S. Publication number 2009-0072240, published Mar. 19, 2009, U.S. Publication number 2009-0146185, published Jun. 11, 2009, U.S. patent application Ser. No. 12/108,449, filed Apr. 23, 2008, U.S. patent application Ser. No. 12/332,284, filed Dec. 10, 2008, U.S. patent application Ser. No. 12/368,248, filed Feb. 9, 2009, and U.S. Publication number 2009-0072269, published Mar. 19, 2009, all of which are hereby incorporated by reference throughout.

For the electronic component of FIG. 6, when the heat sink 27 is a circuit ground, such as a DC ground, or is electrically connected to a circuit ground, and the capacitance between the drain electrode 42 and the circuit ground is not substantial, i.e., it is sufficiently small such that it does not substantially affect or degrade the performance of the component or the circuit containing the component. Consequently, switching losses and EMI or common-mode EMI produced during operation can be reduced for the component of FIG. 6 as compared to that for the components of FIGS. 2-4.

Figure 7:
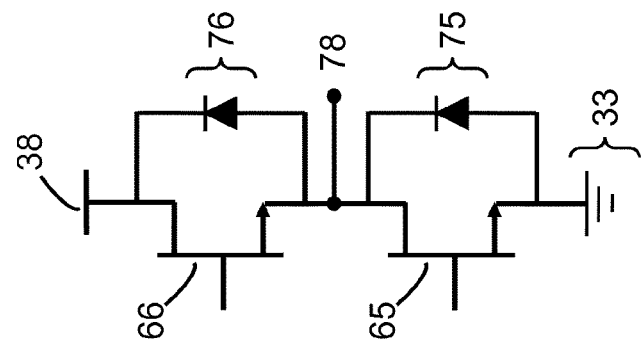
FIG. 7 is a circuit diagram of a half bridge.

FIG. 7 is a circuit diagram of a half bridge, one or more of which can be combined to form a bridge circuit. As seen in FIG. 7, a half bridge includes two switches 65 and 66, both of which are typically formed of high voltage switching transistors, connected as shown. The source of switch 65 is electrically connected to a circuit ground or DC ground 33, the drain of switch 66 is electrically connected to a DC high voltage supply 38, which is an AC ground, and the source of switch 66 is electrically connected to the drain of switch 65. The switch 65 for which the source is electrically connected to ground is typically referred to as a "low-side switch", and the switch 66 for which the drain is electrically connected to the high voltage supply is typically referred to as a "high-side switch". The voltage at which the DC high voltage supply 38 is fixed depends on the particular circuit application, but can typically be about 300V or higher, about 600V or higher, or about 1200V or higher. As seen in FIG. 7, a half bridge also typically includes diodes 75 and 76 connected anti-parallel to switches 65 and 66, respectively. However, it may be possible for these diodes to be eliminated, i.e., to not be included, when specific types of transistors are used for switches 65 and 66, as further described in U.S. patent application Ser. No. 12/368,200, filed Feb. 9, 2009, which is hereby incorporated by reference throughout.

Figure 8:
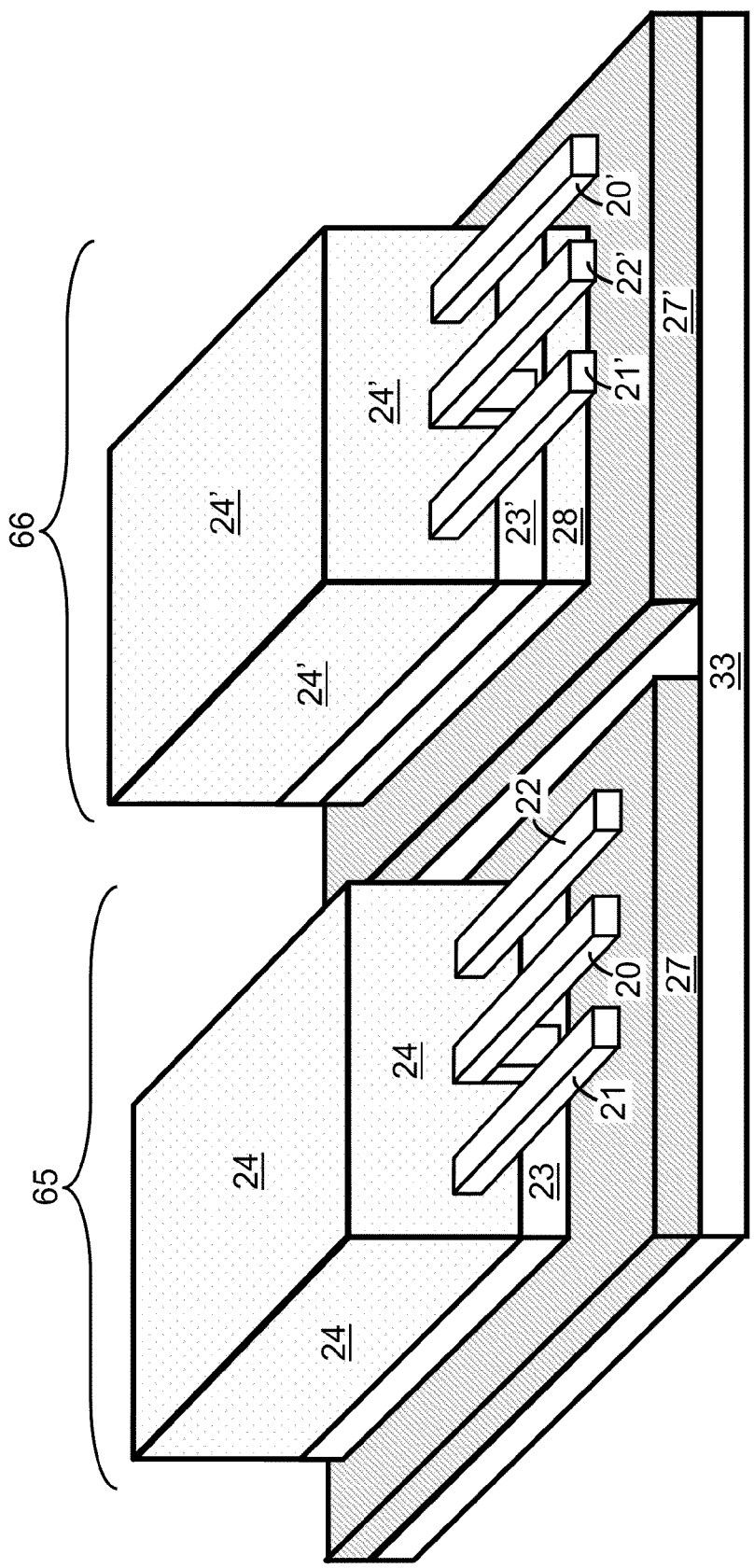
FIG. 8 is a perspective view of components of a half bridge.
Figure 9:
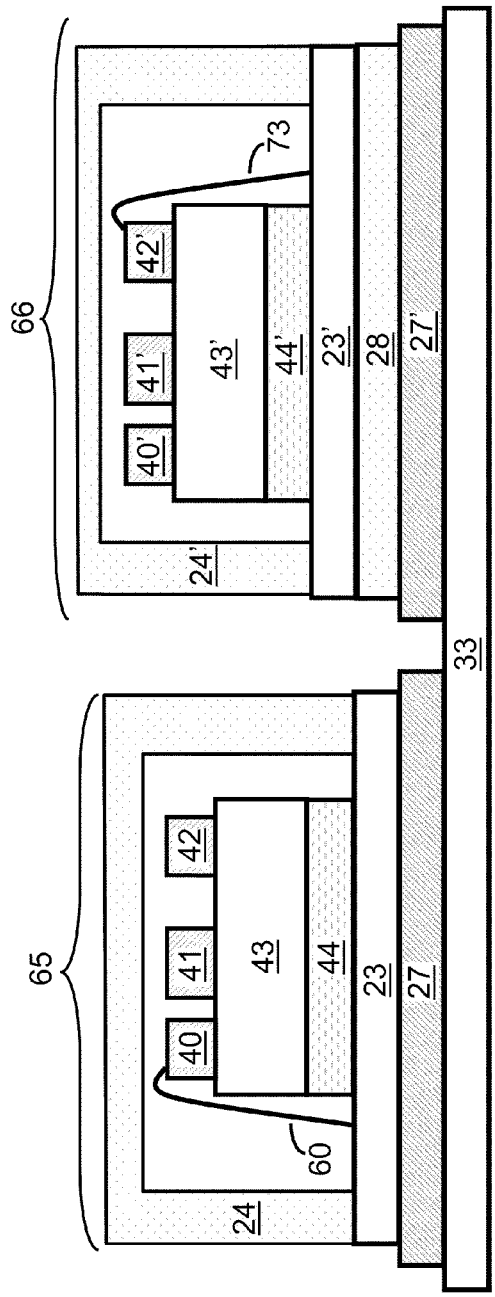
FIG. 9 is a cross-sectional side view of each of the two switches of the half bridge of FIG. 8.

FIGS. 8 and 9 illustrate configurations for each of the two switches of the half bridge of FIG. 7. The switches are each packaged in a configuration that can result in reduced or minimal EMI for the half bridge, particularly as compared to a half bridge where the low-side switch 65 is formed of one of the packaged devices shown in FIGS. 2-4. FIG. 8 shows a perspective view of the half bridge, while FIG. 9 shows a perspective cross-sectional diagram of each of the two switches. For the sake of clarity, some of the features of the assembly of FIGS. 8 and 9 are not shown in the illustrations; however these features are described below. In the assembly of FIGS. 8 and 9, the package configuration for the low-side switch 65 is similar to or the same as that of the packaged transistor of FIG. 6. The low-side switch 65 includes a transistor encased in a package. The transistor can include an insulating or semi-insulating portion 44. The transistor can be mounted directly to the package with the insulating or semi-insulating portion 44 adjacent to or contacting the package base 23. The source electrode 40 of the transistor is electrically connected to the package base 23. The package base 23 is mounted directly to a heat sink 27, and the heat sink is electrically connected to a circuit or DC ground 33, such that the package base 23 and the source electrode 40 are both electrically connected to a circuit or DC ground, i.e., they are grounded or DC grounded. The gate electrode 41 is electrically connected to the gate lead 21 of the package (not shown), and the drain electrode 42 is electrically connected to the drain lead 22 of the package (not shown). The source lead 20 can be electrically connected to the package base 23. The gate lead and the drain lead are both electrically isolated from the package base 23. The transistor included in the low-side switch 65 can be a high voltage switching transistor, and the source, gate, and drain electrodes 40-42, respectively, can all be located on the uppermost side of the transistor. In some implementations, the transistor is a III-N device, such as a III-N HEMT or HFET. In some implementations, the transistor is an enhancement-mode device. In some implementations, the transistor is a lateral device, such as a lateral high voltage switching transistor.

The high-side switch 66 in the assembly of FIGS. 8 and 9 includes a second transistor encased in a second package. The second transistor can include an insulating or semi-insulating portion 44'. The second transistor can be mounted directly to the second package with the insulating or semi-insulating portion 44' adjacent to or contacting the package base 23' of the second package. The drain electrode 42' of the second transistor is electrically connected to the package base 23' of the second package. The gate electrode 41' of the second transistor is electrically connected to the gate lead 21' of the second package (not shown), and the source electrode 40' of the second transistor is electrically connected to the source lead 20' of the second package (not shown). In some implementations, the source, gate, and drain electrodes 40'-42', respectively, are all located on the uppermost side of the transistor, and connector 73, which can be a wire bond, electrically connects the drain electrode 42' to the package base 23' of the second package, as seen in FIG. 9. In other implementations, the drain electrode 42' is on the opposite side of the semiconductor body 43' from the source and gate electrodes 40' and 41', respectively, and the drain electrode 42' is mounted directly to the package base 23' of the second package, as was shown for the packaged transistors in FIGS. 2-4. The drain of the low-side switch is electrically connected to the source of the high-side switch (not shown), which can be achieved by electrically connecting the source lead 20' of the second package to the drain lead 22 of the first package. The drain lead 22' of the second package is electrically connected both to the package base 23' of the second package and to a DC high voltage supply (not shown). The source and gate leads of the second package are both electrically isolated from the second package. The package base 23' of the second package is mounted on a heat sink 27' with an insulating spacer 28 between the package base 23' and the heat sink 27', and the heat sink 27' is electrically connected to the circuit or DC ground 33. The insulating spacer 28 can be made thin to allow heat generated while the transistor is operated to transfer from the transistor to the heat sink through the insulating spacer 28. The high side and low side transistors 66 and 65, respectively, can each be mounted on individual heat sinks 27' and 27, as shown in FIGS. 8 and 9, or they may both be mounted on a single heat sink (not shown). In some implementations, the second transistor is a III-N device, such as a III-N HEMT or HFET or current aperture vertical electron transistor (CAVET). In some implementations, the second transistor is an enhancement-mode device. In some implementations, the second transistor is a lateral device, such as a lateral high voltage switching transistor, while in other implementations it is a vertical device. In some implementations, the transistors used for the two switches 65 and 66 are substantially similar or the same.

Figure 10:
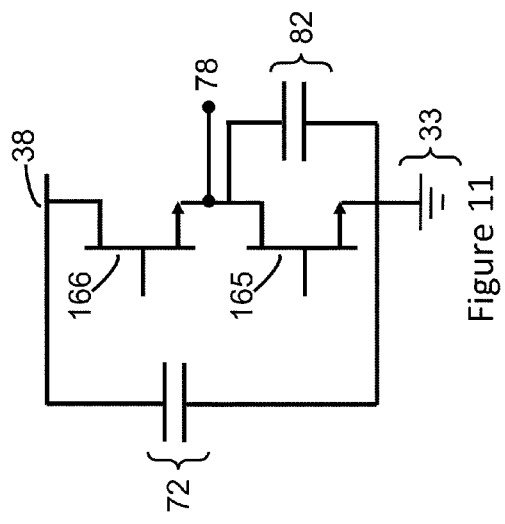
FIGS. 10-11 are circuit diagrams of half bridges.
Figure 11:
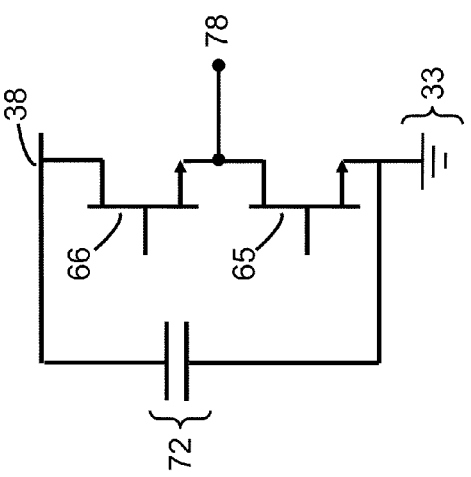

FIG. 10 shows a circuit diagram for the assembly of FIGS. 8 and 9, and FIG. 11 shows a circuit diagram for a half bridge where both switches 165 and 166 are formed of one of the packaged transistors of FIGS. 2-4. Diodes 75 and 76, which were shown in FIG. 7 and in some cases must be included in the half bridge, are omitted from these circuit diagrams but could be included in the half bridge. In addition to switches 65/165 and 66/166, the DC ground 33, and the DC high voltage supply 38, both circuits include a substantial capacitance between the DC high voltage supply 38 and the DC ground, represented by capacitor 72. The capacitance value of capacitor 72 is given by the capacitance between the package base 23' of the high-side switch and the heat sink 27'. This capacitance is substantial, since the package base 23' of the high-side switch has a substantially large cross-sectional area and is separated from the DC ground by a short distance, the distance being the thickness of insulating spacer 28. However, this capacitance does not cause any substantial EMI during circuit operation, since the voltages on either side of the capacitor remain approximately constant. The substantial capacitance of capacitor 72 causes the DC high voltage supply 38 to be AC coupled to DC ground, resulting in the high voltage supply 38 behaving as an AC ground, which can be beneficial to circuit operation. Consequently, the package base 23' of the high-side switch is AC grounded, since it is electrically connected to the DC high voltage supply.

The circuit of FIG. 11 contains a substantial capacitance between the drain electrode of the low-side switch 165 and the DC ground, represented by capacitor 82. As previously described, this substantial capacitance results from the package base of the low-side switch being in close proximity to but not electrically connected to the DC ground. In the configuration of FIGS. 8 and 9, since the package base 23 of the low-side switch 65 is electrically connected to the DC ground, there is no substantial capacitance between the drain electrode of the low-side switch and the DC ground for this configuration. Capacitor 82 can lead to an increase in EMI or common-mode EMI during circuit operation. Hence, the package configuration of FIGS. 8 and 9 can result in lower EMI as compared to a half bridge where each of the switches 165 and 166 is formed of one of the packaged transistors of FIGS. 2-4.

Figure 12:
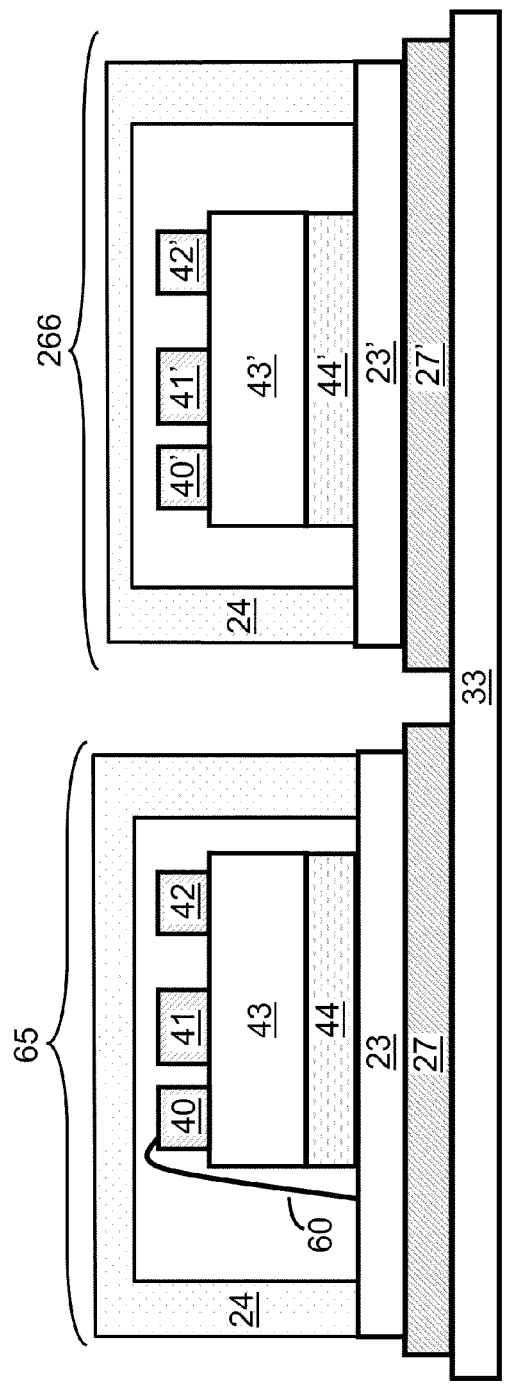
FIG. 12 is a cross-sectional side view of each of the two switches of a half bridge.
Figure 13:
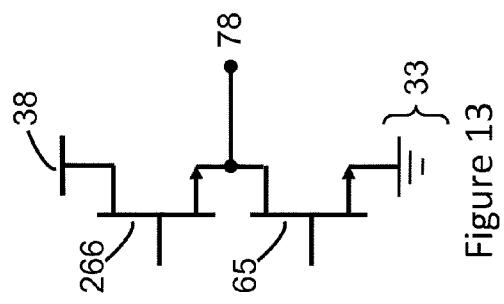
FIG. 13 is a circuit diagram of a half bridge formed of the two switches in FIG. 11.

FIG. 12 illustrates another package configuration for each of the two switches of a half bridge which can result in reduced or minimal EMI for the half bridge, particularly as compared to a half bridge where one of the package configurations shown in FIGS. 2-4 is used for each of the two switches. As with the half bridge of FIGS. 8 and 9, each switch in the half bridge of FIG. 12 is individually packaged. FIG. 13 is a circuit diagram corresponding to the assembly of FIG. 12. Again for the sake of clarity, some of the features of the assembly of FIG. 12 are not shown in the illustration; however these features are described below. In the assembly of FIG. 12, the package configuration for the low-side switch 65 is the same as that described for the low-side switch in FIGS. 8 and 9. However, the high-side switch 266 is configured differently.

The high-side switch 266 again includes a second transistor encased in a second package, the second transistor including an insulating or semi-insulating portion 44' which can be an insulating or semi-insulating substrate. The second transistor is mounted directly to the second package with the insulating or semi-insulating portion 44' adjacent to or contacting the package base 23' of the second package. The source, gate, and drain electrodes 40'-42', respectively, are all located on the uppermost side of the transistor, that is, on the side opposite to the package base 23'. The source electrode 40' is electrically connected to the source lead of the second package (not shown), the gate electrode 41' is electrically connected to the gate lead of the second package (not shown), and the drain electrode 42' is electrically connected to the drain lead of the second package (not shown). The source, gate, and drain electrodes of the second transistor are all electrically isolated from the package base 23' of the second package. The source, gate, and drain leads of the second package are all electrically isolated from the package base 23' of the second package (not shown). The package base 23' of the second package is mounted directly to a heat sink 27', and the heat sink is electrically connected to a circuit or DC ground 33, such that the package base 23' can be electrically connected to DC ground. Again, the high side and low side transistors 266 and 65, respectively, can each be mounted on individual heat sinks 27' and 27, as shown in FIG. 12, or they may both be mounted on a single heat sink (not shown). In some implementations, heat sink 27/27' is substantially free of any electrically insulating material. The drain of the low-side switch is electrically connected to the source of the high-side switch (not shown), which can be achieved by electrically connecting the source lead of the second package to the drain lead of the first package. The drain lead of the second package is electrically connected to a DC high voltage supply (not shown).

In some implementations, the second transistor in FIG. 12 is a III-N device, such as a III-N HEMT or HFET. In some implementations, the second transistor is an enhancement-mode device. In some implementations, the second transistor is a lateral device, such as a lateral high voltage switching transistor. In some implementations, the transistors used for the two switches 65 and 66 are substantially similar or the same.

As seen in the circuit diagram of FIG. 13, the assembly of FIG. 12 lacks the capacitor 82 which led to higher EMI in the circuit depicted by the diagram of FIG. 11, since in FIG. 12 the package base 23 of the low-side transistor is electrically connected to circuit or DC ground. Hence, low EMI can be achieved during circuit operation. Since there is no substantial capacitance between the DC high voltage supply and ground (i.e., no capacitor 72) due to the configuration of high side switch 266, the DC high voltage supply 38 and the circuit or DC ground 33 may need to be coupled with a discrete capacitor to ensure that the DC high voltage supply 38 is an AC ground. Additionally, since in FIG. 12 there is no insulating spacer between the package base 23' of the second package and the heat sink 27', heat generated during circuit operation can be dissipated more readily for the assembly of FIG. 12 than in other half bridge assemblies.

Figure 14:
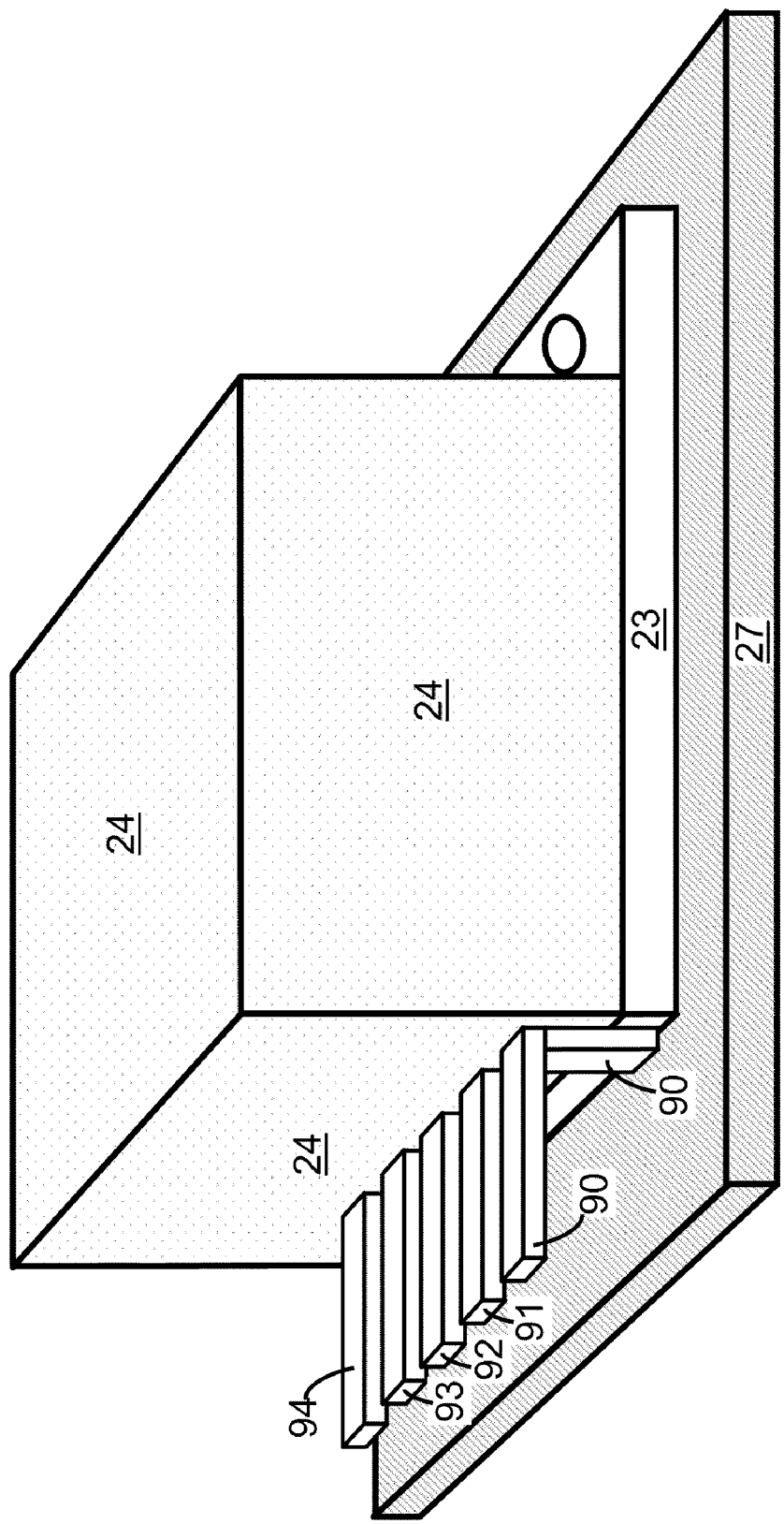
FIG. 14 is a perspective view of a single package that can encase both transistors of a half bridge.

FIG. 14 shows a single package that can encase both transistors of a half bridge. The single package can also encase other devices, such as capacitors, as described below. Hence, the single package, along with the devices which are encased in the package, can form a single electronic component. The single package includes a package base 23 formed of a conducting material, i.e., a conducting structural portion, a case 24 formed of an insulating material, a first gate lead 91, a first drain lead 92, a second gate lead 93, a second drain lead 94, and a first source lead 90 which is electrically connected to the package base 23. The package base 23 can be mounted directly to a heat sink 27 such that the package base 23 and heat sink 27 are in electrical and thermal contact. The heat sink 27 can be a circuit or DC ground, or it may be electrically connected to a circuit or DC ground, such that the heat sink 27 is grounded.

FIGS. 15 and 16 show configurations for the two transistors that are encased in the single package of FIG. 14. Again for the sake of clarity, some of the features of the transistor configurations of FIGS. 15 and 16 are not shown in the illustrations; however these features are described below. Referring to FIG. 15, the low-side and high-side switches 365 and 366, respectively, are both transistors that can each include an insulating or semi-insulating portion 44/44', such as an insulating or semi-insulating substrate. The transistors can both be lateral devices, such as III-N HEMTs, which include source, gate, and drain electrodes 40-42 (or 40'-42'), respectively. The transistors can be high voltage switching transistors. The transistors can both be mounted directly to the package base 23 with the insulating or semi-insulating portions 44/44' adjacent to or contacting the package base 23. The source 40 of the low-side switch 65 is electrically connected to the package base 23, which results in the source 40 being electrically connected to the first source lead 90 of the package (shown in FIG. 14). The gate 41 of the low-side switch 365 is electrically connected to the first gate lead 91 of the package (not shown). The gate 41' of the high-side switch 366 is electrically connected to the second gate lead 93 of the package (not shown). The drain 42' of the high-side switch 66 is electrically connected to the second drain lead 94 of the package (not shown). The drain 42 of the low-side switch 365 and the source 40' of the high-side switch 366 are both electrically connected to the first drain lead 92 of the package (not shown). Hence, the drain 42 of the low-side switch 365 and the source 40' of the high-side switch 366 are electrically connected to one another.

The drain 42' of the high-side switch 366 can also be electrically connected to a terminal of a capacitor 76, which can be mounted to the package with the terminal opposite to the terminal connected to the drain 42' electrically connected to the package base 23. Capacitor 76 can serve the same purpose as the capacitor 72 shown in the circuit diagram of FIG. 10. The configuration of FIG. 15 can simplify the manufacturing process of the half bridge, especially as compared to configurations for which each of the two transistors is encased in its own package. Additionally, including capacitor 76 in the package can reduce the parasitic inductances between the circuit AC grounds (33 and 38 in FIG. 10) and the output node (78 in FIG. 10).

The configuration of FIG. 16 is similar to that of FIG. 15, except that the two transistors 365' and 366' are formed on a common insulating or semi-insulating portion 44, such as an insulating or semi-insulating substrate, and the two transistors can share a common active device layer 43. The drain of the low-side switch and the source of the high-side switch can also be formed of a single electrode 96. The transistors can both be lateral devices, such as III-N HEMTs. The transistors can be high voltage switching transistors. The transistors can be mounted directly to the package base 23 with the common insulating or semi-insulating portion 44 adjacent to or contacting the package base 23. The source 40 of the low-side switch can be electrically connected to the package base 23, which results in the source 40 being electrically connected to the first source lead 90 of the package (see FIG. 14). The gate 41 of the low-side switch can be electrically connected to the first gate lead 91 of the package (connection not shown). The gate 41' of the high-side switch can be electrically connected to the second gate lead 93 of the package (connection not shown). The drain 42' of the high-side switch can be electrically connected to the second drain lead 94 of the package (connection not shown). Electrode 96, which is both the drain of the low-side switch and the source of the high-side switch, can be electrically connected to the first drain lead 92 of the package (connection not shown). The drain 42' of the high-side switch can also be electrically connected to a terminal of a capacitor 76, which can be mounted to the package with the opposite terminal electrically connected to the package base 23. Capacitor 76 can serve the same purpose as the capacitor 72 shown in the circuit diagram of FIG. 9. As compared to the configuration of FIG. 14, this configuration can further simplify the manufacturing process.

A number of implementations have been described. Nevertheless, it will be understood that various modifications may be made without departing from the spirit and scope of the techniques and devices described herein. Accordingly, other implementations are within the scope of the following claims.

What is claimed is:

1. An electronic component comprising a high voltage switching transistor encased in a package, wherein
the package comprises a gate lead, a source lead, a drain lead, a case, and a conductive structural portion,
the high voltage switching transistor comprises a source electrode, a gate electrode, and a drain electrode all on a first side of a semiconductor layer of the high voltage switching transistor,
the case comprises a plurality of sidewalls, with the gate lead, the source lead, and the drain lead each being connected to a first sidewall of the case,
the conductive structural portion of the package is on an opposite side of the semiconductor layer from each of the source electrode, the gate electrode, and the drain electrode, and
the source electrode is electrically connected to the conductive structural portion of the package.

2. The electronic component of claim 1, wherein the high voltage switching transistor is a lateral device.

3. The electronic component of claim 1, wherein the high voltage switching transistor is a III-N transistor.

4. The electronic component of claim 3, wherein the high voltage switching transistor comprises an insulating or semi-insulating substrate.

5. The electronic component of claim 1, wherein the high voltage switching transistor is configured to operate at a bias of about 300V or higher.

6. The electronic component of claim 1, wherein the high voltage switching transistor is an enhancement mode transistor.

7. The electronic component of claim 1, wherein the conductive structural portion of the package comprises a package base.

8. The electronic component of claim 7, wherein the conductive structural portion of the package further comprises the case.

9. The electronic component of claim 1, wherein the conductive structural portion of the package is electrically connected to a heat sink.

10. The electronic component of claim 1, wherein the conductive structural portion of the package is electrically connected to a circuit ground or a DC ground.

11. The electronic component of claim 10, wherein the high voltage switching transistor is a III-N transistor comprising an insulating or semi-insulating portion.

12. The electronic component of claim 11, wherein the insulating or semi-insulating portion is an insulating or semi-insulating substrate.

13. The electronic component of claim 11, wherein the high voltage switching transistor is mounted directly on the conductive structural portion of the package with the insulating or semi-insulating portion adjacent to or contacting the conductive structural portion of the package.

14. The electronic component of claim 1, wherein the package further comprises a gate lead, a source lead, and a drain lead, wherein the drain lead is between the gate lead and the source lead.

15. The electronic component of claim 1, wherein the package further comprises a gate lead, a source lead, and a drain lead, wherein the source lead is between the gate lead and the drain lead.

16. The electronic component of claim 1, wherein the case comprises an insulating material.

17. A half bridge comprising the electronic component of claim 1.

18. The electronic component of claim 1, wherein the package completely surrounds the high voltage switching transistor.

19. An assembly, comprising:
a first transistor encased in a first package, the first transistor comprising a source, a gate, and a drain all on a first side of the first transistor, the first package comprising a first conductive structural portion; and
a second transistor encased in a second package, the second package comprising a second conductive structural portion; wherein
a source of the first transistor is electrically connected to the first conductive structural portion and a drain of the second transistor is electrically connected to the second conductive structural portion.

20. The assembly of claim 19, wherein the first transistor or the second transistor is a high voltage switching transistor.

21. The assembly of claim 19, wherein the first conductive structural portion is mounted directly on a heat sink and is electrically connected to the heat sink.

22. The assembly of claim 19, wherein the first conductive structural portion is electrically connected to a circuit ground or a DC ground.

23. The assembly of claim 19, wherein the second conductive structural portion is electrically connected to a DC high voltage supply.

24. The assembly of claim 23, wherein the second conductive structural portion is separated from a circuit ground or a DC ground by an insulating spacer.

25. The assembly of claim 24, wherein a capacitance between the second conductive structural portion and the circuit ground or the DC ground causes the second conductive structural portion to be AC grounded.

26. The assembly of claim 19, wherein a drain of the first transistor is electrically connected to a source of the second transistor.

27. The assembly of claim 26, wherein the first transistor is a low-side switch and the second transistor is a high-side switch.

28. A half bridge comprising the assembly of claim 19.

29. A bridge circuit comprising a plurality of the half bridges of claim 28.

30. The assembly of claim 19, wherein the first transistor or the second transistor is a III-N transistor.

31. The assembly of claim 19, wherein the second transistor is a lateral device.

32. The assembly of claim 24, wherein the insulating spacer directly contacts each of the second conductive structural portion and the circuit ground or the DC ground.

33. An electronic component comprising a transistor encased in a package, the package surrounding the transistor; wherein
the transistor comprises a source electrode, a gate electrode, a drain electrode, and a semiconductor layer, the electrodes all being on a first side of the semiconductor layer;
the package comprises a gate lead, a source lead, a drain lead, and a case including an insulating portion and an electrically conductive structural portion;
the gate lead, the source lead, and the drain lead all extend from the insulating portion of the case; and
the source lead is between the gate lead and the drain lead.

34. The electronic component of claim 33, wherein the source lead is electrically connected to the electrically conductive structural portion of the case.

35. The electronic component of claim 33, wherein the electrically conductive structural portion of the case is configured to be mounted to a circuit ground or a DC ground.

36. The electronic component of claim 33, wherein the electrically conductive structural portion of the case is configured to be mounted to a heat sink.

37. The electronic component of claim 33, wherein the source electrode is electrically connected to the electrically conductive structural portion of the case.

38. The electronic component of claim 33, wherein the electrically conductive structural portion is proximal to a second side of the semiconductor layer, the second side being opposite the first side.

39. The electronic component of claim 33, wherein the transistor is a high voltage switching transistor.

40. The electronic component of claim 33, wherein the transistor is a III-N transistor.

41. The electronic component of claim 33, wherein the transistor comprises an insulating or semi-insulating substrate.

42. The electronic component of claim 33, wherein the semiconductor layer is a portion of a semiconductor body, the electronic component further comprises an insulating or semi-insulating portion on a side of the semiconductor body opposite the first side of the semiconductor layer, and the transistor is mounted directly on the electrically conductive structural portion of the package with the insulating or semi-insulating portion contacting the electrically conductive structural portion of the package.

43. The electronic component of claim 33, wherein the gate electrode is electrically connected to the gate lead.

44. An electronic component comprising a transistor encased in a package, the package surrounding the transistor; wherein
the package comprises a gate lead, a source lead, a drain lead, and a case including an insulating portion and an electrically conductive structural portion:,
the gate lead, the source lead, and the drain lead all extend from the insulating portion of the case;
the source lead is between the gate lead and the drain lead; and
the transistor is a first transistor and the package is a first package, the electronic component further comprising a second transistor encased in a second package, the second package including a source lead, a gate lead, and a drain lead, the source lead of the second package being electrically connected to the drain lead of the first package.

45. The electronic component of claim 44, wherein the drain lead of the second package is positioned between the source and gate leads of the second package.

46. The electronic component of claim 44, wherein the first transistor or the second transistor is a III-N transistor.

47. The electronic component of claim 44, wherein the source lead of the first package is electrically connected to the electrically conductive structural portion of the case.

* * * * *